United States Patent
Lin et al.

(10) Patent No.: US 8,487,325 B2
(45) Date of Patent: Jul. 16, 2013

(54) LIGHT EMITTING DIODE WITH LARGE VIEWING ANGLE AND FABRICATING METHOD THEREOF

(75) Inventors: Chen-Yen Lin, Keelung (TW);
Yung-Ming Lin, Taichung (TW);
Po-Chun Yeh, Taichung (TW);
Jeng-Wei Yu, New Taipei (TW);
Chih-Ming Lai, New Taipei (TW);
Lung-Han Peng, Taipei (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 13/351,648

(22) Filed: Jan. 17, 2012

(65) Prior Publication Data

US 2012/0228655 A1   Sep. 13, 2012

(30) Foreign Application Priority Data

Mar. 8, 2011 (TW) ............... 100107808 A
Oct. 24, 2011 (TW) ............... 100138543 A

(51) Int. Cl.
*H01L 33/00* (2010.01)
*H01L 21/00* (2006.01)

(52) U.S. Cl.
USPC .................. 257/89; 257/E33.005; 438/31

(58) Field of Classification Search
USPC ........................................................ 257/98
See application file for complete search history.

(56) References Cited

U.S. PATENT DOCUMENTS

| | | | |
|---|---|---|---|
| 5,260,588 A | 11/1993 | Ohta et al. | |
| 6,570,190 B2 | 5/2003 | Krames et al. | |
| 7,928,461 B2 * | 4/2011 | Kao et al. | 257/98 |
| 2005/0199898 A1 * | 9/2005 | Lin et al. | 257/98 |
| 2006/0208273 A1 * | 9/2006 | Kang | 257/103 |
| 2008/0128728 A1 | 6/2008 | Nemchuk et al. | |
| 2009/0085053 A1 | 4/2009 | Chen | |
| 2009/0309107 A1 * | 12/2009 | Kang | 257/88 |
| 2010/0193813 A1 * | 8/2010 | Kao et al. | 257/98 |

FOREIGN PATENT DOCUMENTS

| | | |
|---|---|---|
| KR | 100522844 | 10/2005 |
| KR | 2009010012 | 1/2009 |
| KR | 1020110014521 | 11/2011 |
| WO | 2004070844 | 8/2004 |
| WO | 2006137711 | 12/2006 |
| WO | 2011014490 | 2/2011 |

OTHER PUBLICATIONS

Suthan Kissinger et al, "Enhancement in emission angle of the blue LED chip fabricated on lens patterned sapphire (0 0 0 1)", Solid-State Electronics, 2009, Elsevier Ltd.
European Search report issued Jul. 30, 2012.

\* cited by examiner

*Primary Examiner* — Robert J Hoffberg
*Assistant Examiner* — Igwe U Anya
(74) *Attorney, Agent, or Firm* — WPAT, PC; Justin King

(57) ABSTRACT

A light emitting diode includes a substrate, a plurality of pillar structures, a filler structure, a transparent conductive layer, a first electrode, and a second electrode. These pillar structures are formed on the substrate. Each of the pillar structures includes a first type semiconductor layer, an active layer, and a second type semiconductor layer. The first type semiconductor layers are formed on the substrate. The pillar structures are electrically connected with each other through the first type semiconductor layers. The filler structure is formed between the pillar structures. The filler structure and the second type semiconductor layers of the pillar structures are covered with the transparent conductive layer. The first electrode is in contact with the transparent conductive layer. The second electrode is in contact with the first type semiconductor layer.

17 Claims, 6 Drawing Sheets

LIGHT EMITTING DIODE WITH LARGE VIEWING ANGLE AND FABRICATING METHOD THEREOF

This application claims the benefit of Taiwan Patent Application No. 100107808, filed Mar. 8, 2011, and Taiwan Patent Application No. 100138543, filed Oct. 24, 2011, the subject matters of which are incorporated herein by reference.

FIELD OF THE INVENTION

The present invention relates to a light emitting diode, and more particularly to a light emitting diode with a large viewing angle. The present invention relates to a method of fabricating such a light emitting diode.

BACKGROUND OF THE INVENTION

In gallium nitride-type light emitting diodes (e.g. GaN, AlGaN, InGaN or AlInGaN light emitting diodes), the refractive index difference at the interface between the semiconductor and the air may result in a total reflection phenomenon. Due to the total reflection phenomenon, the viewing angle of the light emitting diode is restricted. Consequently, the researchers make efforts in developing a method for increasing the viewing angle of the light emitting diode.

For example, a light emitting diode package with a large viewing angle is disclosed in US Patent Publication No. 20090085053, which is entitled "Light emitting diode package with large viewing angle". In this literature, a packaging technology is improved to widen the viewing angle of the light emitting diode package. FIG. 1 schematically illustrates a conventional light emitting diode package disclosed in US Patent Publication No. 20090085053. As shown in FIG. 1, the light emitting diode package comprises a substrate 30, a LED chip 32, a transparent housing body 33, a phosphor matrix 34, and an outer reflector 36.

The substrate 30 has an upper surface 38 and a lower surface 40. In addition, a first electrode 42 and a second electrode 44 are disposed on the substrate 30. The LED chip 32 is mounted on the upper surface 38 of the substrate 30. In addition, the LED chip 32 has a positive electrode 321 and a negative electrode 322. The positive electrode 321 of the LED chip 32 is connected with the first electrode 42 of the substrate 30 through a wire 46, and the negative electrode 322 of the LED chip 32 is connected with the second electrode 44 of the substrate 30 by the wire 46.

The transparent housing body 33 is disposed on the upper surface 38 of the substrate 30, and has a cavity 39. The LED chip 32 is disposed within the cavity 39. Moreover, the phosphor matrix 34 is inserted in the cavity 39. Consequently, the light emitted by the LED chip 32 may be transmitted through the phosphor matrix 34 and converted into white light. The white light may be transmitted through the lateral sides of the transparent housing body 33. The light transmitted through the lateral sides of the transparent housing body 33 is reflected by the outer reflector 36, so that the intensity of the light from the LED chip 32 is enhanced.

As described in this literature, the viewing angle of the conventional light emitting diode package is increased from 120 degrees to about 140 degrees.

Furthermore, a method of increasing side light extraction by the slant surface of the sidewall of the light emitting diode is disclosed in for example U.S. Pat. No. 6,570,190, which is entitled "LED having angled sides for increased side light extraction". FIG. 2 schematically illustrates another conventional light emitting diode package disclosed in U.S. Pat. No. 6,570,190. As shown in FIG. 2, the LED comprises p-type and n-type doped epitaxial layers 10. The p-type and n-type layers 10 are arranged to provide a p-n junction region 11 (also referred as an active layer). A transparent substrate 12 and a window layer 13 are located at bilateral sides of the p-type and n-type doped epitaxial layers 10, respectively. A top electrical ohmic contact 14 and a bottom electrical ohmic contact 15 are attached on the surfaces of the transparent substrate 12 and the window layer 13, respectively. The area of the top surface 17 is larger than the area of the active layer 11. In addition, a sidewall 16 of the LED is oriented at an angle β relative to the vertical direction.

Moreover, since the sidewall 16 of the conventional LED has the slant surface, the laterally-transmitted light beams 18 and 19 may be subject to multiple reflection stages. The reflected light beams are directed to the top surface 17 of the LED, or reflected by the top surface 17 of the LED and emerged out of the sidewall.

Moreover, a sapphire substrate for forming a light emitting diode with a large viewing angle is disclosed in Solid-State Electronics 54 (2010) 509-515, which is entitled "Enhancement in emission angle of the blue LED chip fabricated on lens patterned sapphire (0 0 0 1)". In this literature, a sapphire substrate with a special pattern is employed to form a light emitting diode with a large viewing angle.

SUMMARY OF THE INVENTION

The present invention provides a light emitting diode with a large viewing angle. By means of the pillar structure, the light from the active layer can be localized in the pillar structure. Moreover, due to a transparent conductive layer having a subwavelength surface structure, the light exited from the transparent conductive layer has a large viewing angle.

A first embodiment of the present invention provides a light emitting diode. The light emitting diode includes a substrate, a plurality of pillar structures, a filler structure, a transparent conductive layer, a first electrode, and a second electrode. These pillar structures are formed on the substrate. Each of the pillar structures includes a first type semiconductor layer, an active layer, and a second type semiconductor layer. The first type semiconductor layers are formed on the substrate. The pillar structures are electrically connected with each other through the first type semiconductor layers. The filler structure is formed between the pillar structures. The filler structure and the second type semiconductor layers of the pillar structures are covered with the transparent conductive layer. The first electrode is in contact with the transparent conductive layer. The second electrode is in contact with the first type semiconductor layer.

A second embodiment of the present invention provides a fabricating method of a light emitting diode. The method includes the following steps. Firstly, a substrate is provided. Then, a first type semiconductor layer, an active layer, and a second type semiconductor layer are sequentially formed on the substrate. Then, a photolithography and etching process is performed to form a plurality of pillar structures on the substrate. Each of the pillar structures includes the first type semiconductor layer, the active layer, and the second type semiconductor layer. The pillar structures are electrically connected with each other through the first type semiconductor layers. Then, a filler structure is formed between the pillar structures. Then, a transparent conductive layer is formed to cover the filler structure and the second type semiconductor layers of the pillar structures. Afterwards, a first electrode is formed on the transparent conductive layer, and a second electrode is formed on the first type semiconductor layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
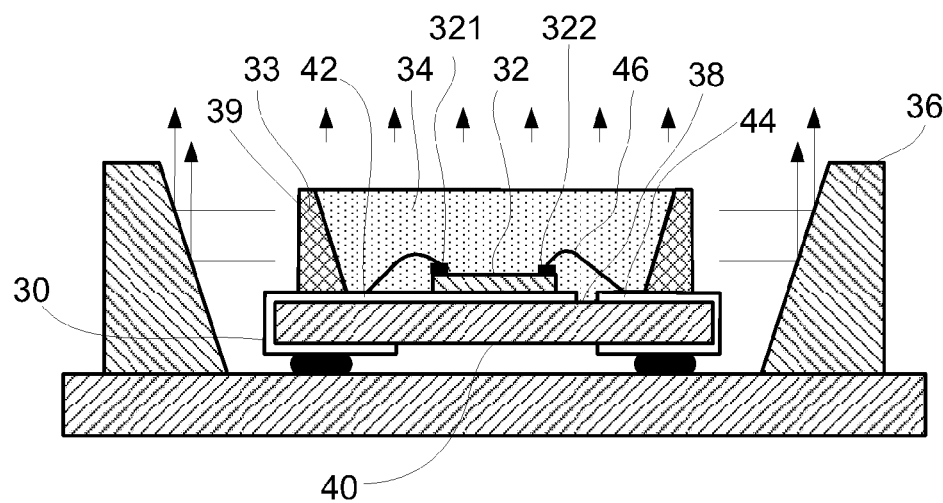
FIG. 1 (prior art) schematically illustrates a conventional light emitting diode package.
Figure 2:
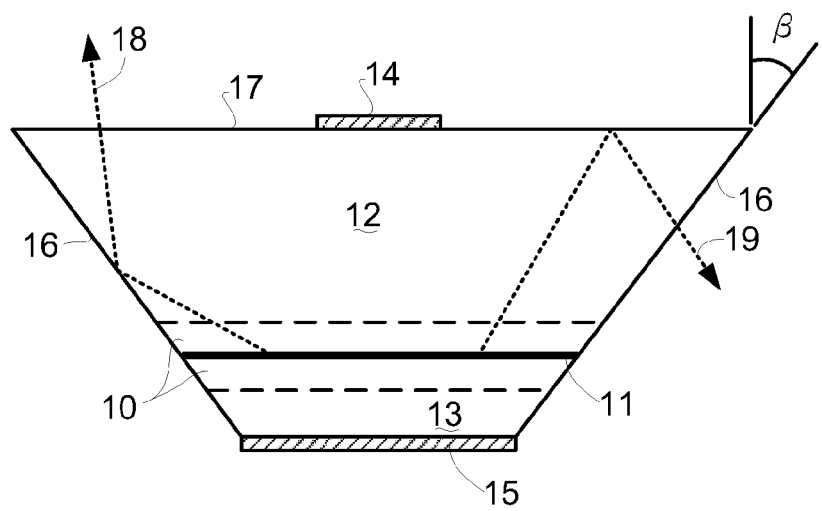
FIG. 2 (prior art) schematically illustrates another conventional light emitting diode package.
Figure 3:
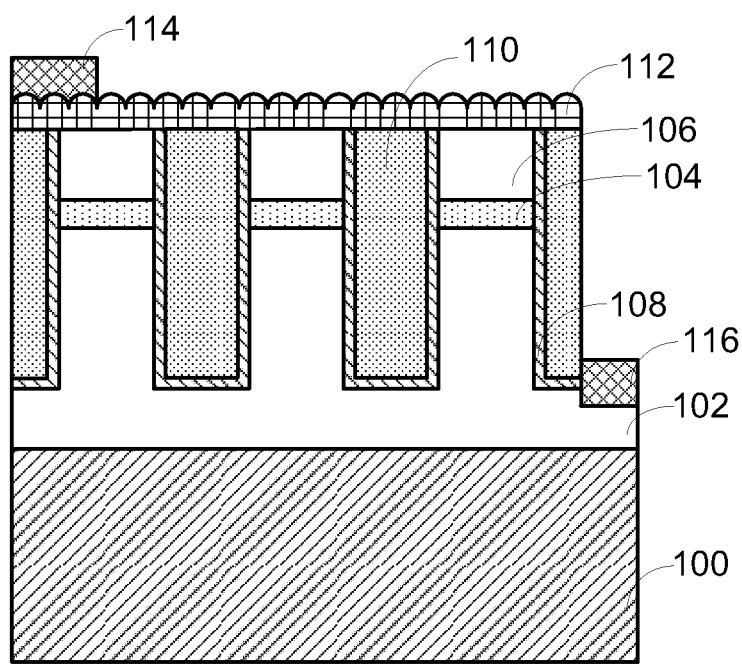
FIG. 3 schematically illustrates a light emitting diode with a large viewing angle according to an embodiment of the present invention.

FIG. 3 schematically illustrates a light emitting diode with a large viewing angle according to an embodiment of the present invention. The light emitting diode is an LED chip. That is, the light emitting diode as shown in FIG. 3 has not been packaged. An example of the LED chip includes but is not limited to a gallium nitride-type LED chip.

As shown in FIG. 3, the light emitting diode comprises a substrate 100 and a plurality of pillar structures. The pillar structures are formed on the substrate 100. Each of the pillar structures comprises an N-type layer 102, an active layer 104, and a P-type layer 106. The N-type layer 102 is formed on the substrate 100. In addition, the N-type layers 102 of these pillar structures are electrically connected with each other.

Moreover, a passivation layer 108 is formed on the sidewalls of these pillar structures and the surfaces of the N-type layers 102. An electrical isolation layer 110 is filled in the regions between the sidewalls of the passivation layer 108. In this embodiment, the passivation layer 108 and the electrical isolation layer 110 may be collectively defined as a filler structure. Moreover, the passivation layer 108, the electrical isolation layer 110 (or the filler structure) and the P-type layers 106 of the pillar structures are covered with a transparent conductive layer 112 which has a subwavelength surface structure. The first electrode 114 is in contact with the subwavelength surface structure of the transparent conductive layer 112. The second electrode 116 is in contact with the N-type layers 102.

FIGS. 4A-4G schematically illustrate a method of fabricating a light emitting diode with a large viewing angle according to an embodiment of the present invention.

Figure 4A:
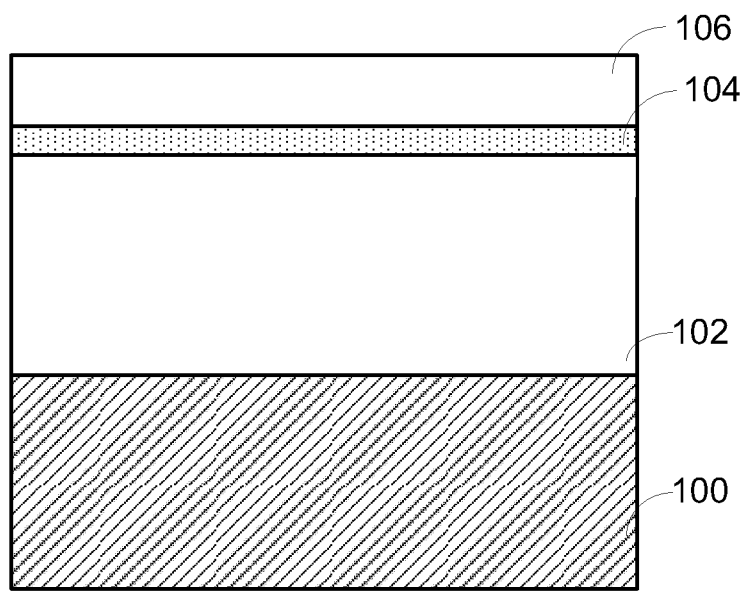
FIGS. 4A-4G schematically illustrate a method of fabricating a light emitting diode with a large viewing angle according to an embodiment of the present invention.

Firstly, as shown in FIG. 4A, an N-type layer 102, an active layer 104 and a P-type layer 106 are formed on a substrate 100. The N-type layer 102, the active layer 104 and the P-type layer 106 are so-called p-i-n structures.

Figure 4B:
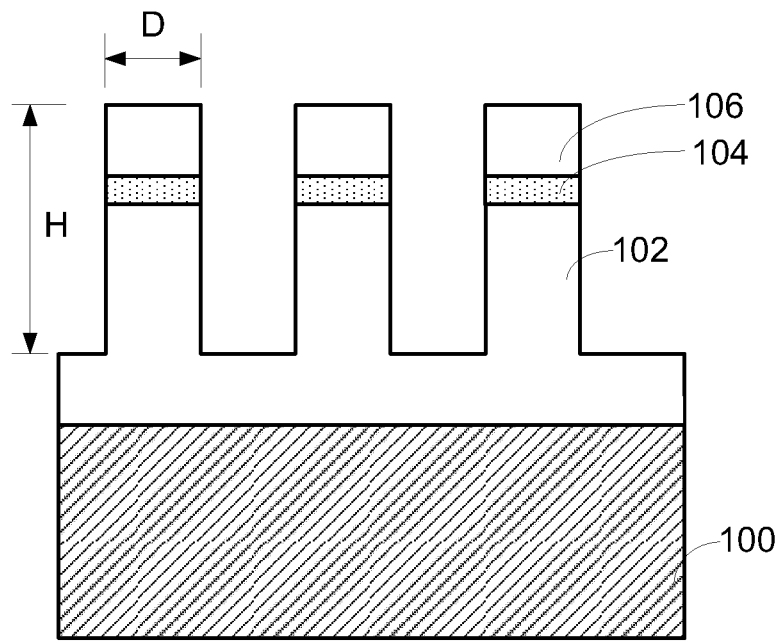

Then, as shown in FIG. 4B, a photolithography and etching process is performed to form a plurality of pillar structures on the substrate 100. These pillar structures may have various shapes such as cylindrical shapes, triangular prism shapes, cuboid shapes, hexagonal prism shapes, or polygonal prism shapes. Moreover, each pillar structure has the p-i-n structure. The bottoms of these pillar structures are electrically connected with each other through the N-type layers 102. In this embodiment, the width D of the pillar structure is in the range between $\lambda/2$ and 20 μm (i.e. $\lambda/2 < D \leq 20$ μm), and the height H of the pillar structure is in the range between 0 and 10 μm (i.e. $0 < H \leq 10$ μm), wherein $\lambda$ is the wavelength of the light emitted from the light emitting diode.

Figure 4C:
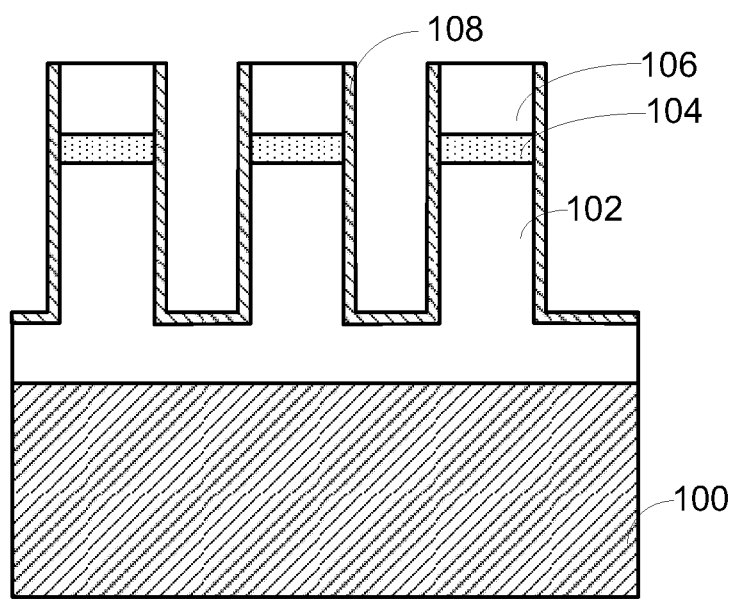

Then, as shown in FIG. 4C, a passivation layer 108 is formed on the sidewalls of these pillar structures and the surfaces of the N-type layers 102 by a photo-enhanced wet oxidation process, a high temperature oxidation process, an atomic layer deposition process or a chemical vapor deposition process. In this embodiment, the passivation layer 108 is made of a first dielectric material having a chemical formula $(Al_xIn_yGa_z)_{2-\delta}O_3$, wherein $x+y+z=1$ and $0 \leq \delta < 1$.

Figure 4D:
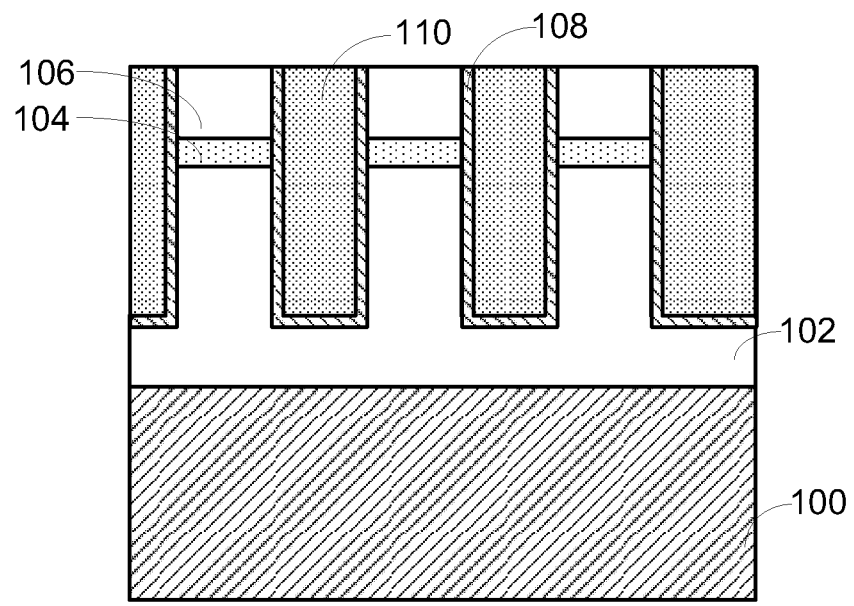

Then, as shown in FIG. 4D, a second dielectric material is filled in the regions between the sidewalls of the passivation layer 108 to be served as an electrical isolation layer 110. The second dielectric material is for example silicon dioxide ($SiO_2$), hafnium oxide ($HfO_2$), aluminum oxide ($Al_2O_3$), silicon nitride ($Si_3N_4$) or tantalum pentoxide ($Ta_2O_5$). The passivation layer 108 and the electrical isolation layer 110 may be collectively defined as a filler structure.

Figure 4E:
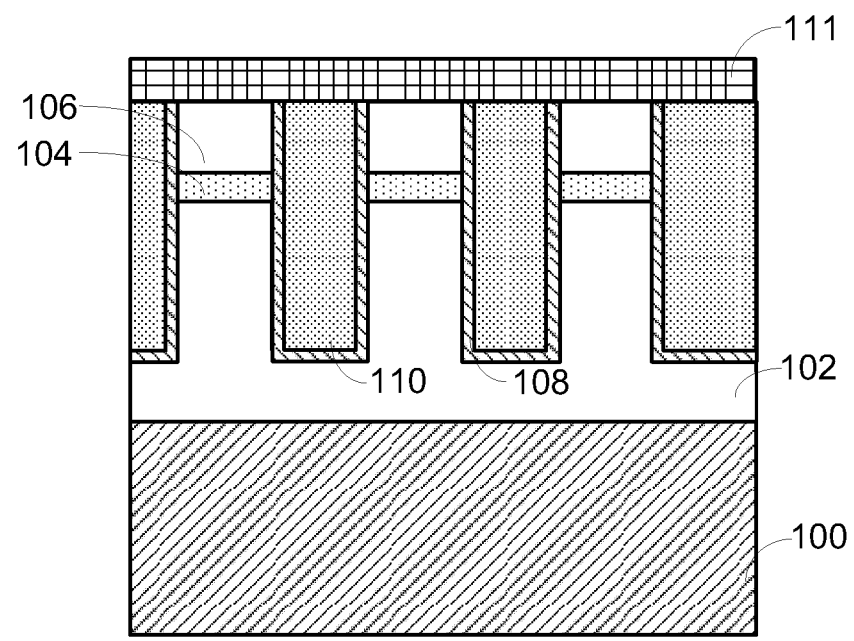

Then, as shown in FIG. 4E, the passivation layer 108, the electrical isolation layer 110 and the P-type layers 106 of the pillar structures are covered with a third dielectric material, which is served as a transparent conductive layer 111. For example, the third dielectric material is indium tin oxide (ITO), indium trioxide ($In_2O_3$), tin oxide ($Sn_2O_3$), zinc oxide (ZnO) or $NiO_x$, wherein $0 < x \leq 1$. The refractive index n of the transparent conductive layer 111 is in the range between 1 and 2 (i.e. $1 < n < 2$).

Figure 4F:
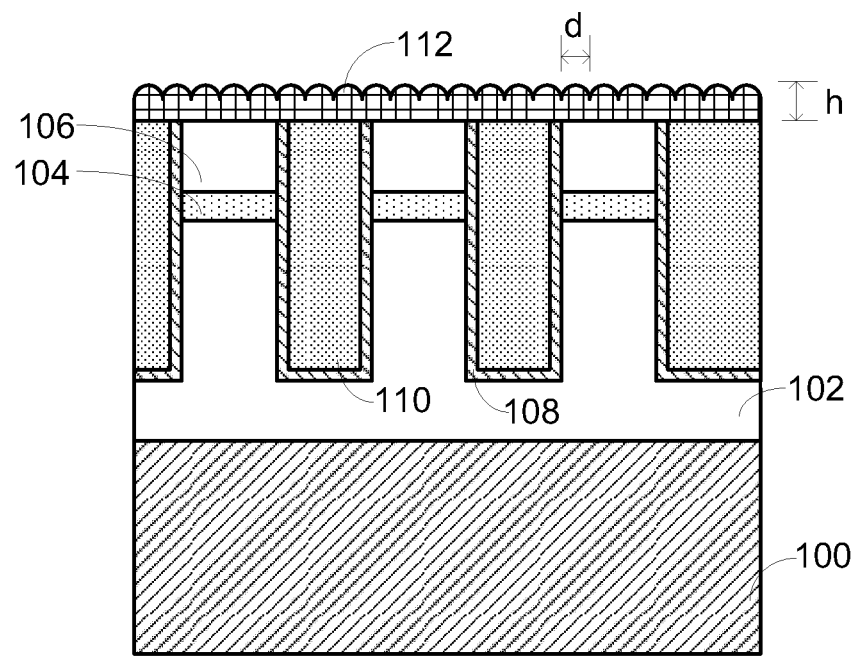

Then, as shown in FIG. 4F, a photolithography and etching process is performed to partially remove the transparent conductive layer 111, thereby forming a transparent conductive layer 112 having a subwavelength surface structure. In this embodiment, the height h of the subwavelength surface structure is in the range between 0 and 2 μm (i.e. $0 < h \leq 2$ μm), and the width d of the subwavelength surface structure is in the range between 0 and 500 nm (i.e. $0 < d \leq 500$ nm).

Figure 4G:
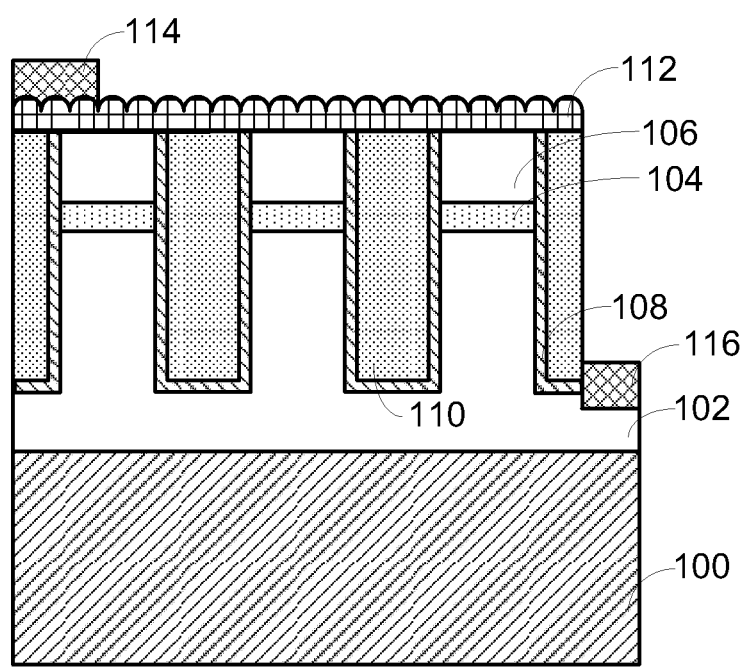

Then, as shown in FIG. 4G, a first electrode 114 is in contact with the subwavelength surface structure of the transparent conductive layer 112, and a second electrode 116 is in contact with the N-type layers 102.

In this embodiment, the total distribution area of the pillar structures is higher than the area of the substrate 100 by about 20%-30%. The pillar structure may be considered as the core portion of an optical fiber, and the passivation layer 108 may be considered as a cladding layer of the optical fiber. Consequently, the light from the active layer 104 is localized in the pillar structure. Moreover, due to the diffraction and scattering of the subwavelength surface structure of the transparent conductive layer 112, the light emitting diode has a widened viewing angle. In addition, the electrical isolation layer 110 is effective to reduce the leakage current of the light emitting diode to $10^{-9}$ A.

Figure 5:
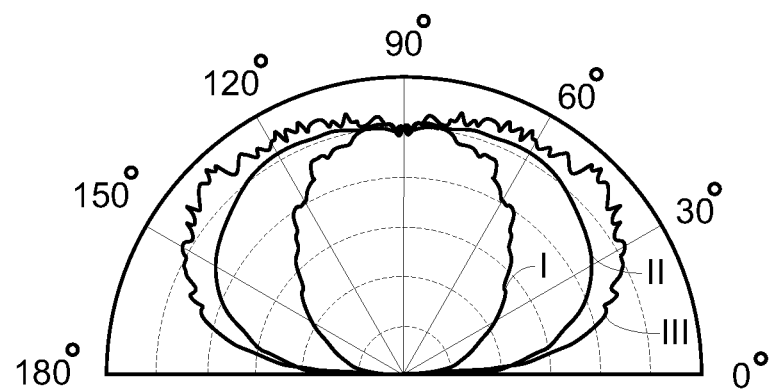
FIG. 5 is a LED radiation diagram illustrating the comparison between the conventional light emitting diode and the present light emitting diode.

FIG. 5 is a LED radiation diagram illustrating the comparison between the conventional light emitting diode and the present light emitting diode. In this embodiment, the light emitting diode is an InGaN light emitting diode. The curve I denotes the radiation distribution of the conventional planar LED. The curve II denotes the radiation distribution of the present LED whose pillar structure has a width D=1 μm. The curve III denotes the radiation distribution of the present LED whose pillar structure has a width D=2 μm. In this embodiment, the largest viewing angle of the present LED can be greater than 160 degrees.

From the above description, the present invention provides a light emitting diode with a large viewing angle and a method of fabricating such a light emitting diode. By means of the pillar structure, the light from the active layer can be localized in the pillar structure. In addition, the light exited from the transparent conductive layer has a large viewing angle.

In the above embodiments, the transparent conductive layer 112 has a subwavelength surface structure. Alternatively, in some embodiments, the subwavelength surface structure may be omitted. That is, the step as shown in FIG. 4F is omitted, and the first electrode 114 is directly formed on the transparent conductive layer 111.

Moreover, the patterns and the fabricating methods of the first electrode 114 and the second electrode 116 are not restricted as long as the first electrode 114 is in contact with the transparent conductive layer and the second electrode 116 is in contact with the N-type layer 102. Alternatively, the locations of the N-type layers 102 and the P-type layers 106 may be exchanged while forming the light emitting diode of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A light emitting diode, comprising:
    a substrate;
    a plurality of pillar structures formed on the substrate, wherein each of the pillar structures comprises a first type semiconductor layer, an active layer, and a second type semiconductor layer, wherein the first type semiconductor layers are formed on the substrate, and the pillar structures are electrically connected with each other through the first type semiconductor layers;
    a filler structure formed between the pillar structures, wherein the filler structure includes a passivation layer formed on sidewalls of the pillar structures and surfaces of the first type semiconductor layers and the passivation layer is made of a first dielectric material having a chemical formula $Al_xIn_yGa_z)_{2-\delta}O_3$, wherein x+y+z=1 and $0 \leq \delta < 1$;
    a transparent conductive layer, wherein the filler structure and the second type semiconductor layers of the pillar structures are covered with the transparent conductive layer;
    a first electrode in contact with the transparent conductive layer; and
    a second electrode in contact with the first type semiconductor layer.

2. The light emitting diode as claimed in claim 1, wherein the first type semiconductor layer is an N-type layer, and the second type semiconductor layer is a P-type layer.

3. The light emitting diode as claimed in claim 1, wherein the pillar structure has a width in a range between λ/2 and 20 μm, and the pillar structure has a height in a range between 0 and 10 μm, wherein λ is a wavelength of a light from the light emitting diode.

4. The light emitting diode as claimed in claim 1, wherein the filler structure comprises:
    an electrical isolation layer filled between sidewalls of the passivation layer.

5. The light emitting diode as claimed in claim 4, wherein the electrical isolation layer is made of a second dielectric material, wherein the second dielectric material is silicon dioxide ($SiO_2$), hafnium oxide ($HfO_2$), aluminum oxide ($Al_2O_3$), silicon nitride ($Si_3N_4$) or tantalum pentoxide ($Ta_2O_5$).

6. The light emitting diode as claimed in claim 1, wherein the transparent conductive layer is made of a third dielectric material, wherein the third dielectric material is indium tin oxide (ITO), indium trioxide ($In_2O_3$), tin oxide ($Sn_2O_3$), zinc oxide (ZnO) or $NiO_x$ wherein $0<x \leq 1$.

7. The light emitting diode as claimed in claim 1, wherein the transparent conductive layer further has a subwavelength surface structure.

8. The light emitting diode as claimed in claim 7, wherein the subwavelength surface structure has a height in a range between 0 and 2 μm, and the subwavelength surface structure has a width in a range between 0 and 500 nm.

9. A fabricating method of a light emitting diode, the fabricating method comprising steps of:
    providing a substrate;
    sequentially forming a first type semiconductor layer, an active layer, and a second type semiconductor layer on the substrate;
    performing a photolithography and etching process to form a plurality of pillar structures on the substrate, wherein each of the pillar structures comprises the first type semiconductor layer, the active layer, and the second type semiconductor layer, wherein the pillar structures are electrically connected with each other through the first type semiconductor layers;
    forming a filler structure between the pillar structures, wherein the filler structure includes a passivation layer formed on sidewalls of the pillar structures and surfaces of the first type semiconductor layers and the passivation layer is made of a first dielectric material having a chemical formula $(Al_xIn_yGa_z)_{2-\delta}O_3$, wherein x+y+z=1 and $0 \leq \delta < 1$;
    forming a transparent conductive layer to cover the filler structure and the second type semiconductor layers of the pillar structures;
    forming a first electrode on the transparent conductive layer; and
    forming a second electrode on the first type semiconductor layer.

10. The fabricating method as claimed in claim 9, wherein the first type semiconductor layer is an N-type layer, and the second type semiconductor layer is a P-type layer.

11. The fabricating method as claimed in claim 9, wherein the pillar structure has a width in a range between λ/2 and 20 μm, and the pillar structure has a height in a range between 0 and 10 μm, wherein λ is a wavelength of a light from the light emitting diode.

12. The fabricating method as claimed in claim 9, wherein the step of forming the filler structure comprises sub-steps of:
    forming the passivation layer on sidewalls of the pillar structures and surfaces of the first type semiconductor layers; and
    filling an electrical isolation layer between sidewalls of the passivation layer.

13. The fabricating method as claimed in claim 12, wherein the passivation layer is formed by a photo-enhanced wet oxidation process, a high temperature oxidation process, an atomic layer deposition process or a chemical vapor deposition process.

14. The fabricating method as claimed in claim 12, wherein the electrical isolation layer is made of a second dielectric material, wherein the second dielectric material is silicon dioxide ($SiO_2$), hafnium oxide ($HfO_2$), aluminum oxide ($Al_2O_3$), silicon nitride ($Si_3N_4$) or tantalum pentoxide ($Ta_2O_5$).

15. The fabricating method as claimed in claim 9, wherein the transparent conductive layer is made of a third dielectric material, wherein the third dielectric material is indium tin oxide (ITO), indium trioxide ($In_2O_3$), tin oxide ($Sn_2O_3$), zinc oxide (ZnO) or $NiO_x$, wherein $0<x\leq1$.

16. The fabricating method as claimed in claim 9, wherein the transparent conductive layer further has a subwavelength surface structure.

17. The fabricating method as claimed in claim 16, wherein the subwavelength surface structure has a height in a range between 0 and 2 μm, and the subwavelength surface structure has a width in a range between 0 and 500 nm.

* * * * *